United States Patent [19]
Boskamp

[11] Patent Number: 5,256,971
[45] Date of Patent: Oct. 26, 1993

[54] MULTIPLE LOOP COIL WITH IMPROVED DECOUPLING

[75] Inventor: Eddy B. Boskamp, Menomonee Falls, Wis.

[73] Assignee: Medical Advances, Inc., Wauwatosa, Mich.

[21] Appl. No.: 884,676

[22] Filed: May 18, 1992

[51] Int. Cl.[5] .............................................. G01V 3/00
[52] U.S. Cl. .................................. 324/318; 128/653.5
[58] Field of Search ............... 324/307, 309, 318, 322; 128/653.5

[56] References Cited

U.S. PATENT DOCUMENTS

| | | | |
|---|---|---|---|
| 4,721,913 | 1/1988 | Hyde et al. | 324/318 |
| 4,766,383 | 8/1988 | Fox et al. | 324/318 |
| 4,825,162 | 4/1989 | Roemer et al. | 324/318 |
| 4,918,388 | 4/1990 | Mehdizadeh et al. | 324/322 |
| 4,928,064 | 5/1990 | Keren | 324/322 |
| 4,943,775 | 7/1990 | Boskamp et al. | 324/318 |
| 4,973,908 | 11/1990 | Bottomley et al. | 324/318 |
| 5,030,915 | 7/1991 | Boskamp et al. | 324/318 |

Primary Examiner—Louis Arana
Attorney, Agent, or Firm—Quarles & Brady

[57] ABSTRACT

A quadrature coil for receiving NMR signals in magnetic resonance imaging employs as few as two substantially coplanar overlapping loops having sensitivity along perpendicular lines in a region of sensitivity. Each loop is sensitive to a fluctuating uniform magnetic field but is decoupled by a decoupling network. A common ground point shared between the two loops allows the combination of the signals produced by the two loops with a hybrid combiner without the coupling of the loops through the signal's grounds. A third loop may be added to the two loops to produce a third signal to further improve the signal-to-noise ratio of the coil.

10 Claims, 7 Drawing Sheets

MULTIPLE LOOP COIL WITH IMPROVED DECOUPLING

BACKGROUND OF THE INVENTION

1. Field of the Invention.

The field of the invention is magnetic resonance imaging (MRI) and, in particular, local coils for use in receiving MRI signals.

2. Background Art.

A. MRI Imaging

In MRI, a uniform magnetic field $B_0$ is applied to an imaged object along the z axis of a Cartesian coordinate system, the origin of which is approximately centered within the imaged object. The effect of the magnetic field $B_0$ is to align the object's nuclear spins along the z axis.

In response to a radio frequency (RF) excitation signal of the proper frequency, oriented within the x-y plane, the nuclei precess about the z-axis at their Larmor frequencies according to the following equation:

$$\omega = \gamma B_0$$

where $\omega$ is the Larmor frequency, and $\gamma$ is the gyromagnetic ratio which is constant and a property of the particular nuclei.

Water, because of its relative abundance in biological tissue and the properties of its nuclei, is of principle concern in such imaging. The value of the gyromagnetic ratio $\gamma$ for water is 4.26 kHz/gauss and therefore, in a 1.5 Tesla polarizing magnetic field $B_0$, the resonant or Larmor frequency of water is approximately 63.9 MHz.

In a typical imaging sequence for an axial slice, the RF excitation signal is centered at the Larmor frequency $\omega$ and applied to the imaged object at the same time as a magnetic field gradient $G_z$ is applied. The gradient field $G_z$ causes only the nuclei, in a slice through the object along a x-y plane, to have the resonant frequency $\omega$ and to be excited into resonance.

After the excitation of the nuclei in this slice, magnetic field gradients are applied along the x and y axes. The gradient along the x axis, $G_x$, causes the nuclei to precess at different frequencies depending on their position along the x axis, that is, $G_x$ spatially encodes the precessing nuclei by frequency. The y axis gradient, $G_y$, is incremented through a series of values and encodes the y position into the rate of change of phase of the precessing nuclei as a function of gradient amplitude, a process typically referred to as phase encoding.

A weak nuclear magnetic resonance generated by the precessing nuclei may be sensed by the RF coil and recorded as an NMR signal. From this NMR signal, a slice image may be derived according to well known reconstruction techniques. An overview NMR image reconstruction is contained in the book "Magnetic Resonance Imaging, Principles and Applications" by D. N. Kean and M. A. Smith.

B. Local Coils

The quality of the image produced by MRI techniques is dependent, in part, on the strength of the NMR signal received from the precessing nuclei. For this reason, it is known to use an independent RF receiving coil placed in close proximity to the region of interest of the imaged object to improve the strength of this received signal. Such coils are termed "local coils" or "surface coils". The smaller area of the local coil permits it to accurately focus on NMR signals from the region of interest. Further, the RF energy of the field of such a local coil is concentrated in a smaller volume giving rise to improved signal-to-noise ratio in the acquired NMR signal.

The signal-to-noise ratio of the NMR signal may be further increased by orienting two coils at 90° angles about the imaged object so that each detects RF energy along one of a pair of mutually perpendicular axes. This technique is generally known as quadrature detection and the signals collected are termed quadrature signals.

The outputs of the quadrature coil pairs are combined so as to increase the strength of the received signal according to the simple sum of the output signals from the coils. The strength of the uncorrelated noise component of these signals, however, will increase only according to the square root of the sum of the noise voltage increases times the $\sqrt{2}$ of the noise components. As a result, the net voltage signal-to-noise ratio of the combined quadrature signals increases by approximately $\sqrt{2}$ over the voltage signal-to-noise ratio of the individual signals.

The quadrature orientation of the two coils introduces a 90° phase difference between the NMR signals detected by these coils. Therefore, combining the outputs from the two quadrature coils, to achieve the above described signal-to-noise ratio improvement, requires that one signal be shifted to have the same phase as the other signal so that the amplitudes of the signals simply add. Such phase shifting and combining is typically accomplished by means of a hybrid network. Hybrid networks are four-port networks known in the art and having the property that when the four ports are properly terminated, energy input to two of the ports, with the proper relative phase angles, will be combined at one of the remaining two ports. The antenna coils are attached to two of the ports and the output lead is attached to a third port. The remaining uncommitted port is connected to a termination resistor.

As used herein, the term quadrature coil and quadrature signal, will refer to the detecting of the NMR signal along multiple axes and combining the signals so collected, with the appropriate phase shifts to produce a signal of improved signal-to-noise ratio.

C. Planar Coils

The use of quadrature coils of conventional design may be undesirably constraining to the patient who must be positioned between two coils within the relatively small volume of the magnet bore. Further, in order that the local coil may be conveniently located on the patient, it is necessary that the quadrature local coil be substantially open on one side.

It is known, therefore, for certain imaging applications such as the imaging of the spine, to construct a local coil on a substantially planar cradle to be attached to the upper surface of the patient support table so that the patient may simply lie on top of the coil and so that the coils structure is not unduly constraining. Such open coils are termed "planar" coils to distinguish them from "whole volume" coils such as might be constructed of opposed saddle coils or solenoids. The prior art has recognized the desirability of a quadrature, planar coil. See, for example, U.S. Pat. No. 4,721,913 issued January 26 to Hyde et al.

Figure 1:
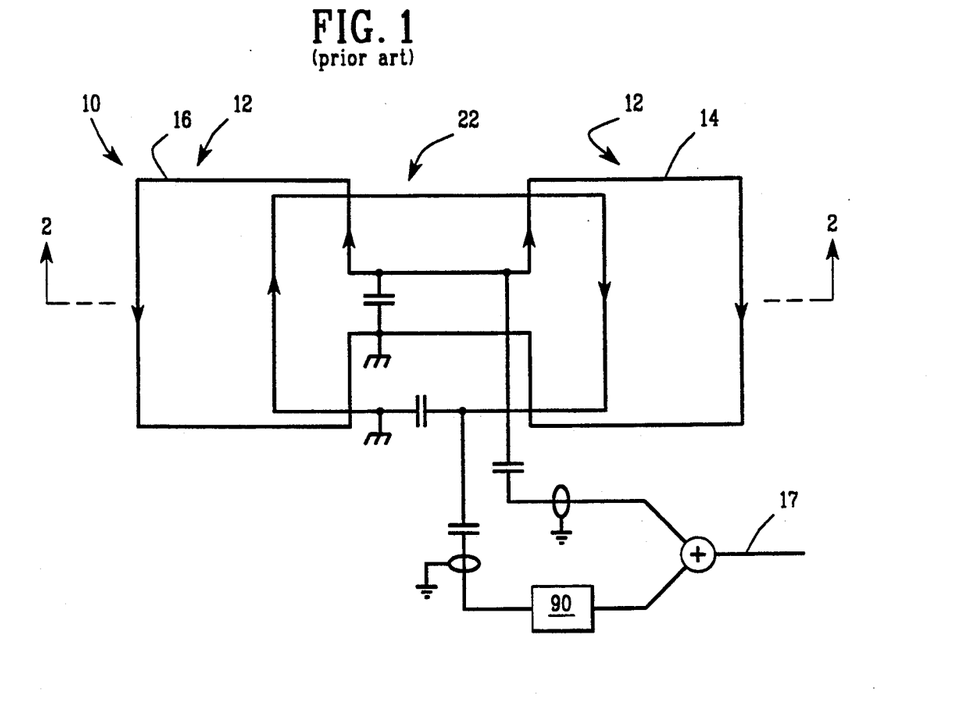
FIG. 1 is a schematic diagram of a prior art quadrature planar coil employing a butterfly coil and a loop coil as discussed above.
Figure 2:
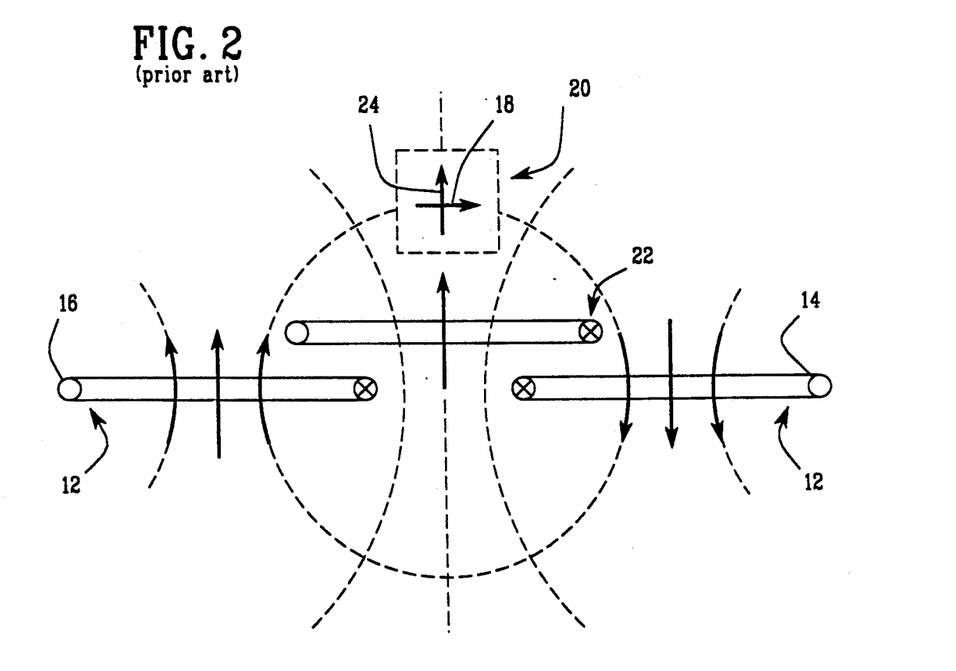
FIG. 2 is a cross-section in elevation of the quadrature coil of FIG. 1 showing the region of sensitivity.

As shown in FIGS. 1 and 2, such quadrature, planar coils 10 may employ two components, a butterfly coil 12 having two loops 14 and 16 to be sensitive to horizontal components of flux 18 within a region of sensitivity 20, and an ordinary loop coil 22 centered on the butterfly to detect vertical components of flux 24 within region 20. The signal from the two loops 14 and 16 of the butterfly coil 12 is combined with the signal from the loop coil 22, after one is shifted by 90°, to form a quadrature signal 17.

The two loops 14 and 16 of the butterfly coil 12 are sensitive only to countercyclic current flows as a result of the geometry of their connection. Current flow is indicated by the arrows on loops 14 and 16 in FIG. 1 and the cross superimposed on the cross-section of the loops 14 and 16 in FIG. 3, which, per convention indicates a receding flow of current. Accordingly, the butterfly coil 12 is generally insensitive to fluctuating uniform magnetic fields which induce cancelling co-cyclic currents in each of the loops 14 and 16.

An improvement to this design employing a butterfly coil 12 and loop coil 22 is taught in U.S. Pat. No. 5,030,915, issued Jul. 9, 1991 to Boskamp, the same inventor as that of the present invention, this patent incorporated herein by reference. In the Boskamp design, the butterfly coil 12 and loop coil 22 is realized by superimposed currents on a single coil structure, that structure being generally a loop bisected by a single conductor. This single structure provides improved resistance to misalignment.

SUMMARY OF THE INVENTION

The present invention is a planar coil providing a simplified coil structure with as few as two receiving loops. The receiving loops are connected at a virtual ground so as to avoid the need for RF traps in the returns to the signal lines. A third loop may be used to provide a signal-to-noise ratio improvement exceeding that of conventional quadrature coils.

Specifically, the coil receives NMR signals from precessing nuclei by means of a first and second loop, each responsive to a uniform magnetic field (and in that way unlike the above described butterfly coil and conventional whole volume quadrature coils). The first and second loops have first and second reception patterns, respectively, which couple to corresponding magnetic fields of a first and second orientation within the imaging volume to produce a first and second signal. The first and second orientations have an angular separation of $\theta$ measured in the direction of the precession of the nuclei. A phase shift network receives the second signal to shift it by 90° to produce a shifted second signal, and a combiner receives and combines the first signal and the shifted second signal to produce the quadrature signal.

It is thus one object of the invention to provide an improved planar quadrature coil employing a simplified topology of two loops.

The first and second loops may be joined electrically at a virtual ground point and the NMR signals from these loops measured between a point on each loop and the virtual ground. The virtual ground may be a point between two equal series capacitors positioned in the loops.

It is another object of the invention, therefore, to simplify the combining of the two signals. The use of a common virtual ground for the two signals being combined eliminates the need for radio-frequency traps in the shields of the return lines of the signals as would otherwise be necessary to prevent coupling between the two loops.

The first and second loops may be constructed as simple rectangular conductors overlapping at two points so that the area of overlap may be adjusted independently along two perpendicular axes within the plane of the loops.

It is thus another object of the invention to produce a coil topology that allows the ready adjustment of the height of the imaging volume while preserving isolation between the loops. The height of the imaging volume is determined by the distance between two parallel overlapping segments of the loops while the coupling may be controlled by the amount of overlap area, each quantity being separately adjustable.

The first and second loops include isolation from uniform magnetic fields provided by diode decoupling networks.

It is thus yet a further object of the invention to eliminate the complex coil topologies associated with "self isolating" coil designs, such as the butterfly coil, by employing decoupling networks.

In a second embodiment, a third loop responsive to a uniform magnetic field, is positioned to be isolated from the first and second loops and to have a third reception pattern which couples to a magnetic field of a third orientation within the imaging volume to produce a third signal, the third orientation having an angular separation from the first orientation $\theta_2$ measured in the direction of the precession of the nuclei. Mutual coupling between all three coils is negligible and therefore noise is uncorrelated. The signals produced by the coils may be acquired in parallel and combined after image reconstruction to produce an image with a higher signal-to-noise ratio than is produced by a quadrature coil.

It is thus another object of the invention to produce a planar coil with a signal-to-noise ratio greater than that produced by a conventional, two-loop quadrature coil The third loop develops a third signal having noise independent from that received by the other two loops which may be combined with the signals from the other two loops to reduce the effect of noise on the signal.

Other objects and advantages besides those discussed above will be apparent to those skilled in the art from the description of the preferred embodiment of the invention which follows. Thus, in the description, reference is made to the accompanying drawings, which form a part hereof, and which illustrate one example of the invention. Such example, however, is not exhaustive of the various alternative forms of the invention. Therefore, reference should be made to the claims which follow the description for determining the full scope of the invention.

DESCRIPTION OF THE PREFERRED EMBODIMENT

Figure 3:
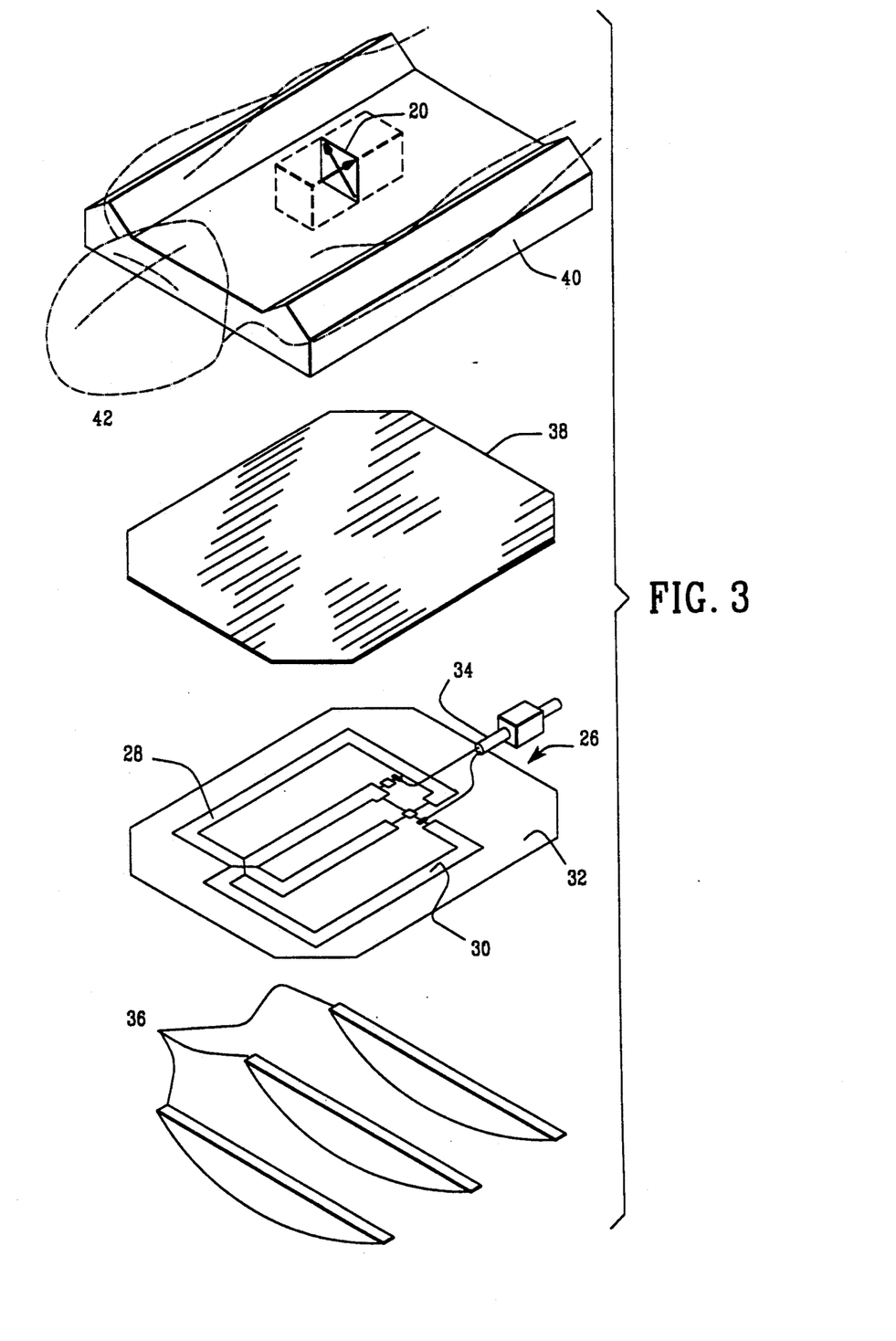
FIG. 3 is an exploded perspective view of the quadrature planar coil of the present invention showing the position of the patient with respect to the coil loops.

Referring to FIG. 3, a quadrature coil 26, useful for imaging the spine, comprises a first and second rectangular antenna loop 28 and 30 arranged in overlapping configuration on generally planar support plate 32. The support plate 32 also holds various discrete electronic components (to be described below) and provides a point of attachment for multiple signal cable 34 communicating the NMR signal received by the quadrature coil 26 to associated NMR equipment (not shown).

Fastened to a bottom side of the support plate 32 are ribs 36, the upper edges of which are flat to fit against the support plate 32 and the lower edges of which curve to conform to the upper side of a patient support table (not shown). A cover plate 38 fits on a top side of the support plate 32 to cover and protect the quadrature coil 26 and its associated electronics.

A channel shaped cushion 40 fits over the top of the cover plate 38 and support plate 32 to cushion a supine patient 42 over the quadrature coil 26 and positioned so that a region of sensitivity 20 of the quadrature coil 26 lies approximately along the patient's spine.

The support plate and cover plate 32 and 38 may be constructed of a resilient non-conductive plastic such as Lexan and the channel shaped cushion 40 is preferably an elastomeric foam, such as polyurethane, as is commercially available.

Figure 4A:
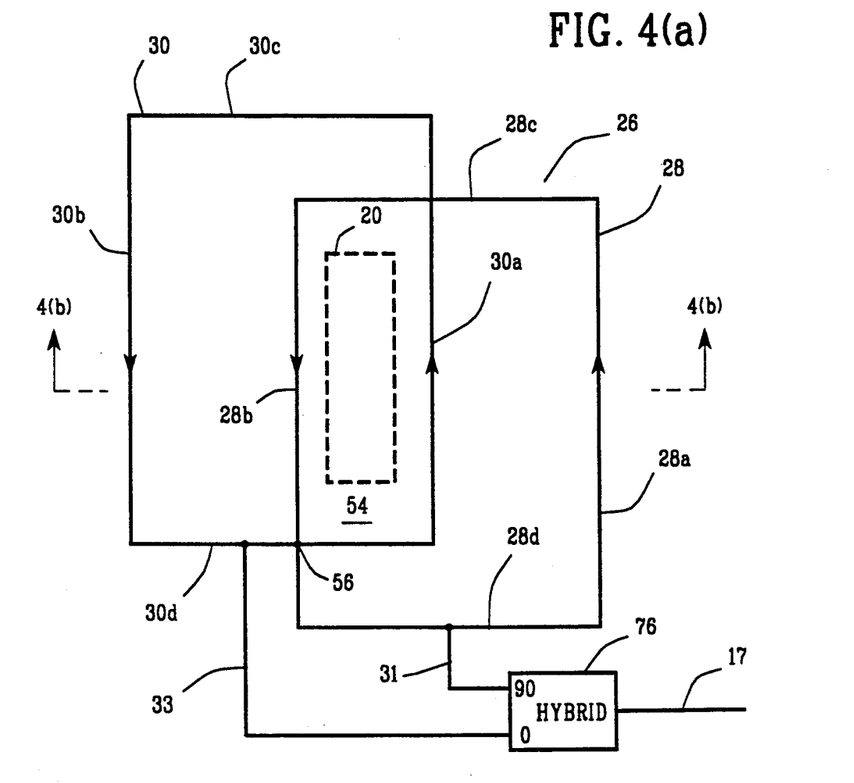
FIG. 4(a) is a schematic representation showing the relative positioning of the two loops of a first embodiment of the coil of FIG. 3.

Referring to FIG. 4(a), loops 28 and 30 are equal sized rectangles, the former having right and left sides 28a and 28b and the latter having right and left sides 30a and 30b, respectively. Likewise, loop 28 has superior and inferior sides 28c and 28d, and loop 30 has superior and inferior sides 30c and 30d, respectively. The loops 28 and 30 are positioned to overlap so that 28c crosses 30a and 28b crosses 30d and thus define an overlap area 54 between 28b, 30d, 30a and 28c and an overlap distance 78 being the separation between 28b and 30a. As will be described, this overlap distance 78 may be varied to adjust the height of a region of sensitivity 20 and the overlap area 54 may be adjusted to eliminate electromagnetic coupling between loops 28 and 30.

Figure 5:
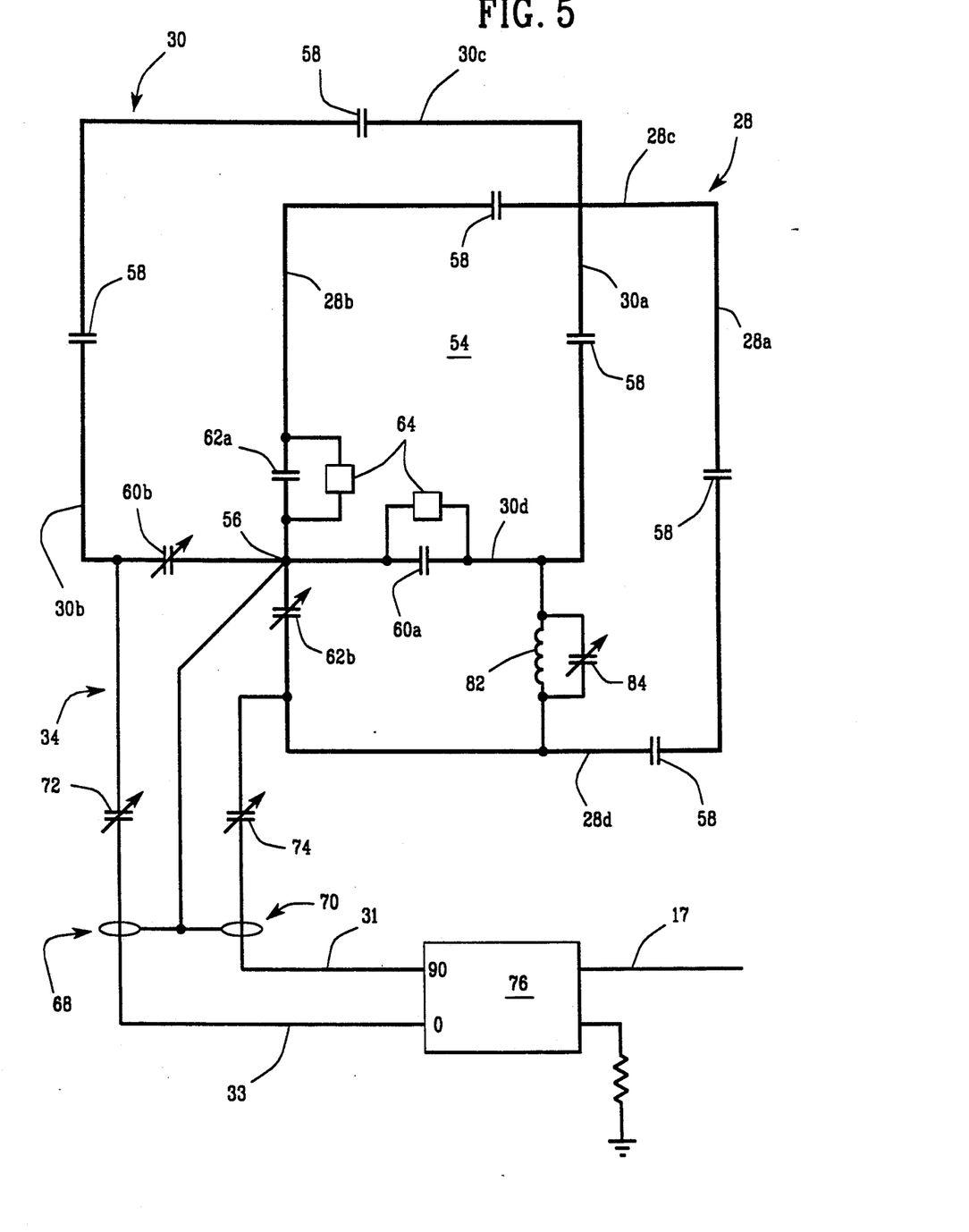
FIG. 5 is an electrical schematic of the two loops of the coil of FIG. 4(a) showing their interconnection at a virtual ground point and the combining of the quadrature signals from each loop.

Referring now to FIG. 5, loops 28 and 30 are electrically insulated from each other except at a virtual ground point 56 where 28b crosses 30d. Loops 28 and 30 are, in the preferred embodiment, copper foil laminated to the support plate 32. Where side 28c crosses 30a, the foil of the 28b and 30d is separated by an insulator (not shown) and the sides 28c and 30a are necked down to reduce their area where they cross and therefore to minimize capacitive coupling between loops 28 and 30.

As is generally understood in the art, each of the sides of loops 28 and 30 are broken by capacitances so that the distributed inductance of the loops 28 and 30 and the series capacitors breaking the loops, together provide a series resonance circuit tuned to the Larmor frequency of the spinning nuclei. Specifically, sides 30c, 30a, 30b, 28a, 28c, and 28d are each broken at approximately their midpoints by capacitors 58. Side 30d is broken by two substantially equal capacitors 60a and 60b centered on either side of the virtual ground point 56, whereas side 28b is broken by substantially equal capacitors 62a and 62b also centered about the virtual ground point 56.

It will be understood to those of ordinary skill in the art that capacitors 62 and 60 are placed with respect to virtual ground 56 so that virtual ground 56 has a constant zero voltage even with varying current flow through either loop 28 or 30. For example, capacitor 62a and 62b may be adjusted so that the impedance of the loops is perfectly bisected by virtual ground 56 and therefore that virtual ground 56 remains at a constant zero voltage with current flow through the loops. Capacitor 60b and 62b are variable so that they may be adjusted with respect to their corresponding capacitor 60a or 62a to insure this bisection is true and to compensate for any unbalancing by capacitors 72 and 74 to be described.

Figure 4B:
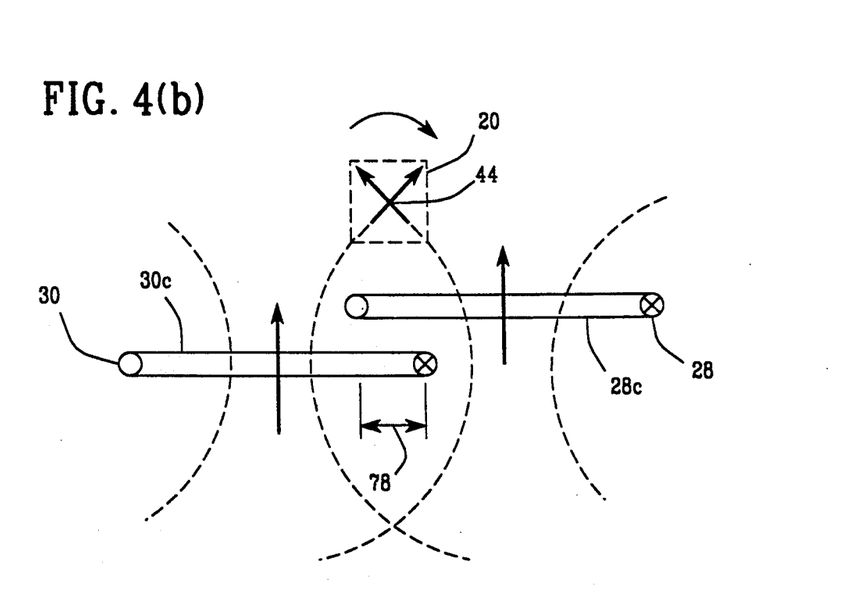
FIG. 4(b) is a cross-section in elevation of the loops of the coil of FIG. 4(a) showing the current flow through those loops and the flux paths in the region of sensitivity for the coil.

Referring to FIG. 4(b) for nuclear spins in the region of sensitivity 20, producing a clockwise rotating magnetic vector 44, rectangular loops 30 and 28 will experience induced co-cyclic currents. The phase of the current in loop 28 will lead the phase of the current in loop 30 by 90°. This phase difference is obtained by positioning the region of interest 20 over the overlapping portion 54 of loops 28 and 30 so that loop 28 is sensitive to flux angled toward loop 30 and away from the axis of loop 28 by 45°, and loop 30 is sensitive to flux angled toward loop 28 and away from the axis of loop 30 at 45°. It is noted that unlike the prior art butterfly and loop pair coils, the detection axes for loops 28 and 30 are oblique with respect to the plane of the loops but are nevertheless mutually orthogonal to provide true 90° quadrature detection.

A combined quadrature signal 17 is obtained from the signals from loops 28 and 30 by phase shifting the signal 31 derived from loop 28 by 90° and summing that phase shifted signal to the signal 33 from loop 30 by means of hybrid network 76.

Each of the loops 28 and 30 are sensitive not only to the quadrature components of the magnetic vector 44 in the region of sensitivity 20 but also to any variations in a uniform magnetic field intercepted by these loops. Strongly varying uniform magnetic fields may be created during the RF excitation stage of the magnetic resonance imaging sequence by a radio frequency coil used to stimulate the nuclei.

Accordingly, decoupling must be employed on both loops 28 and 30 to detune the loops with respect to varying uniform magnetic fields such as would be caused by the stimulating RF signal. The passive decoupling is performed by two decoupling networks 64, one placed so as to shunt each of capacitors 60a and 62a, respectively. These decoupling networks 64 consist of back-to-back diodes in series with an inductance (not shown) and serve to open loops 28 and 30 during excitation (or high voltage across the diodes) and to close the loops 28 and 30 during detection. This is accomplished by the diodes connecting the inductors across the capacitors 60a and 62a for high voltage signals across the capacitors and disconnecting the inductors from the capacitors for low voltage signals. The inductances are selected so that for high voltage signals, when they are connected across the capacitors 62a or 60a, a parallel resonance circuit is created producing a band-stop filter which effectively decouples the loops 30 and 28 from these high amplitude signal sources.

The NMR signals from the loops 28 and 30 may be measured across capacitor 62b for loop 28 and across capacitor 60b for loop 30. The center conductor of a first co-axial cable 68, being half of multiple signal cable 34, is connected to the terminal of capacitor 60b not connected to the virtual ground 56 and the shield of that co-axial cable 68 is connected to virtual ground 56. Likewise, the center conductor of co-axial cable 70, forming the other half of multiple signal cable 34, is connected to the side of capacitor 62b not connected to virtual ground 56 and the shield of that co-axial cable 70 is also connected to virtual ground 56.

By superimposing the virtual ground of loops 28 and 30 at virtual ground 54, the shields of both co-axial cables 68 and 70 may be joined without risk of increasing the coupling of loops 30 and 28. Importantly, therefore, no radio frequency traps are required to be placed in series with the shields of cables 64 and 70 to prevent interaction between the loops 28 and 30 and hence undesired coupling between those loops.

Capacitors 72 and 74 are connected in series with the center conductors of co-axial cables 68 and 70 to match the impedance of the coil network to 50Ω. Each of capacitors 62 and 60 and capacitors 72 and 74 are in close proximity, but have been depicted as spaced apart in FIG. 5 for the sake of clarity.

As noted above, for clockwise rotation of the precessing nuclei in the region of sensitivity 20 (shown in FIG. 4(b)), the signal from loop 28 will precede that from loop 30 by 90°. Accordingly, the center conductors of co-axial cables 68 and 70 are connected to two ports of a hybrid combiner 76 which serves the functions of creating a phase lag of 90° in the signal from loop 28, and summing the signals from loops 28 and 30 together to form an output quadrature signal per block 76 previously described. The hybrid combiner 76 is a four port network of capacitors and inductors having the property that when the four ports are properly terminated, energy input to two of the ports with the proper relative phase angles will be combined in phase at one of the remaining ports. A desirable property of the hybrid network 76 is that a reflected energy resulting from an impedance mismatch at one output port, most typically from a change in antenna coil impedance as a result of electrical coupling to a patient, is partially directed to the fourth uncommitted port. This results in a further degree of electrical isolation between the ports of the hybrid network and hence between the two loops 28 and 30.

Figure 6:
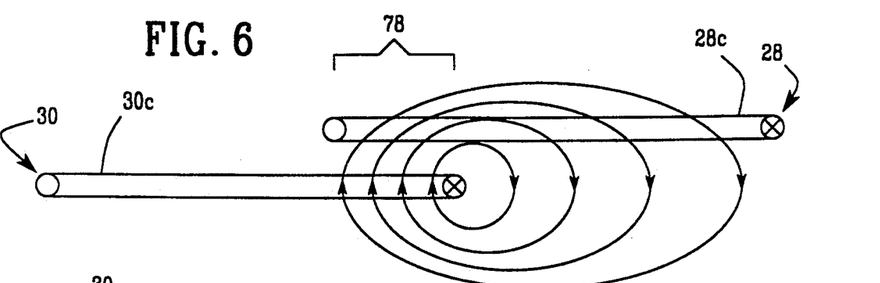
FIG. 6 is a cross-section in elevation of the two loops of the coil of FIG. 4(a) showing the flux pattern produced by a single side of one loop illustrating the elimination of inductive coupling between the two loops by the particular spacing apart of those loops.

Referring now to FIG. 6, the degree of overlap between loops 28 and 30 is selected to reduce the inductive coupling between the loops 28 and 30. Specifically, the overlap distance 78 between conductors 30a and 28b is adjusted so that for current flow through loop 30, and in particular through conductors 30a and 30d, approximately an equal number of flux lines pass upward through loop 28 in the overlap region 54 as pass downward through loop 28 through the remaining non-overlapping regions of loop 28. When this condition is met, the inductive coupling between loop 30 and loop 28 is minimized.

Figure 7A:
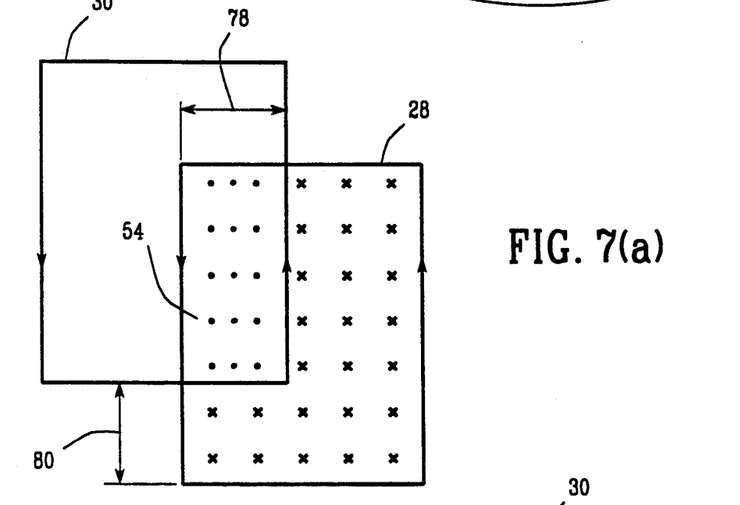
FIGS. 7(a) and 7(b) are plan schematic views of the two loops of the coil of FIG. 4(a) showing the adjustment of the overlap area to accommodate different overlap spacing distances.
Figure 7B:
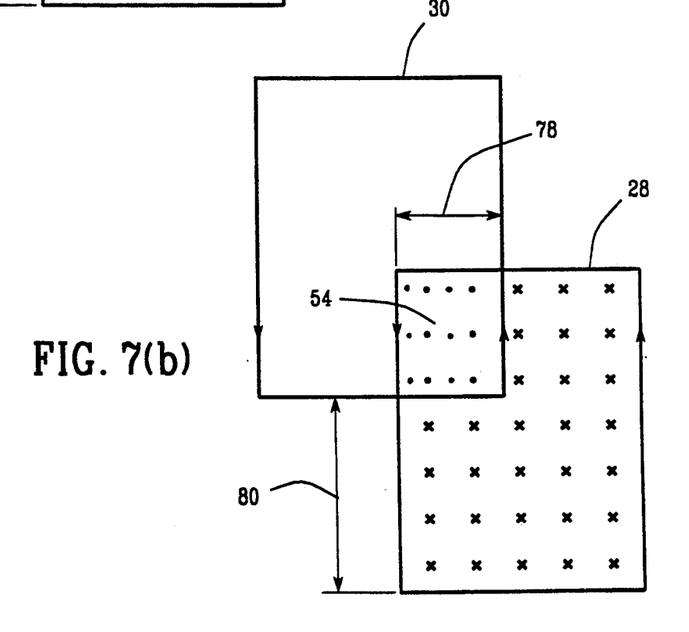

Referring momentarily to FIG. 4b, the height of the region of sensitivity 20 above the plane of the loops 28 and 30 is determined largely by the overlap distance 78. Accordingly, it is desirable that the overlap distance 78 be adjustable without increasing the coupling inductance between loops 28 and 30. Referring to FIGS. 7a and 7b, this adjustment may be accomplished by simultaneously changing the staggering distance 80, representing the distance between conductors 30d and 28b or 30c and 28c, so that with increases in the overlap distance 78 (to raise the region of sensitivity 20), the staggering distance 80 is also increased so as to ensure that the total flux passing through region 54 is equal and opposite to the total flux passing through loop 28 outside of region 54.

Referring again to FIG. 5, small amounts of mutual inductance or capacitance remaining after the proper adjustment of the overlap between loops 28 and 30, as above described, may be tuned out by parallel-connected inductor 82 and capacitor 84, the latter of which is adjustable, which are connected between loops 28 and 30 so that inductor 82 and capacitor 84, in parallel with any residual coupling inductance or capacitance between the loops 28 and 30, form a blocking series resonance circuit at the Larmor frequency. The network of 82 and 84 will be capacitive when there is net coupling inductance and inductive when there is net coupling capacitance.

Figure 8:
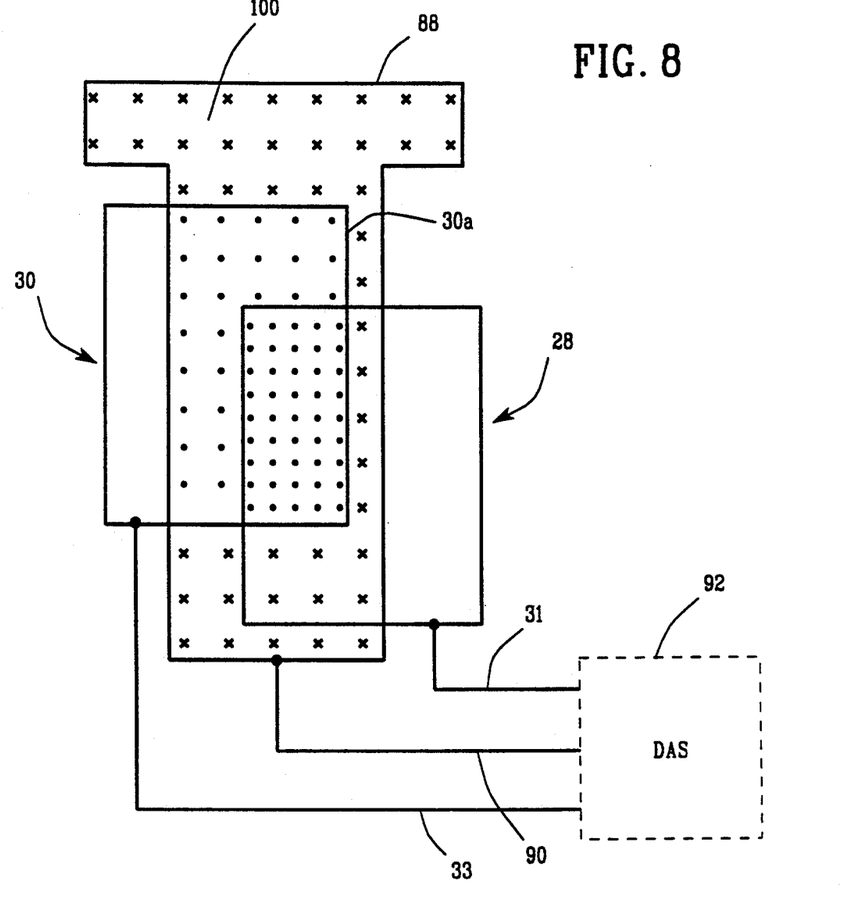
FIG. 8 is a schematic representation showing the relative positioning of three loops of a second embodiment of the planar coil of the present invention.
Figure 9:
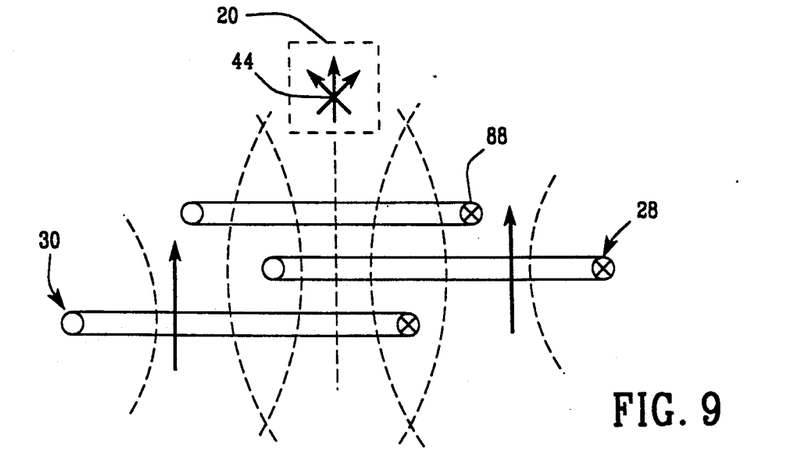
FIG. 9 is a cross-section in elevation of the loops of the coil of FIG. 8 showing the current flow through those loops and the flux paths in the region of sensitivity for the coil.

In a second embodiment as shown in FIGS. 8 and 9, a third loop 88 may be positioned in overlapping configuration with loops 28 and 30 to provide a third signal 90 having a phase halfway between the phase of signals 31 and 33 from loops 28 and 30 respectively. The phase of signal 90 of loop 88 results from its being positioned directly below the region of sensitivity (as seen in FIG. 9) to be sensitive to flux components of the magnetic vector 44 having a vertical orientation bisecting the angle formed by the vector sensitivities of loops 28 and 30 which, as described above, are canted at 45° on either side of vertical.

For the three signals 31, 33, and 90, signal-to-noise ratio considerations make it preferable that any phase shifting and combining be accomplished mathematically after the signals have been acquired by the MRI system. Specifically, each of the signals 31, 33, and 90 is sampled and digitized in parallel by the MRI system's data acquisition system 92 and the data of the signals combined after image reconstruction, as will be generally understood in the art.

As shown in FIG. 8, third loop 88 deviates from the rectangular form of loops 28 and 30, and has generally a T-shaped outline where a horizontal portion 100 of the "T" is positioned outside of loops 28 and 30 and serves to provide isolation from inductive coupling between loops 88, 28 and 30 as will be described.

Figure 10:
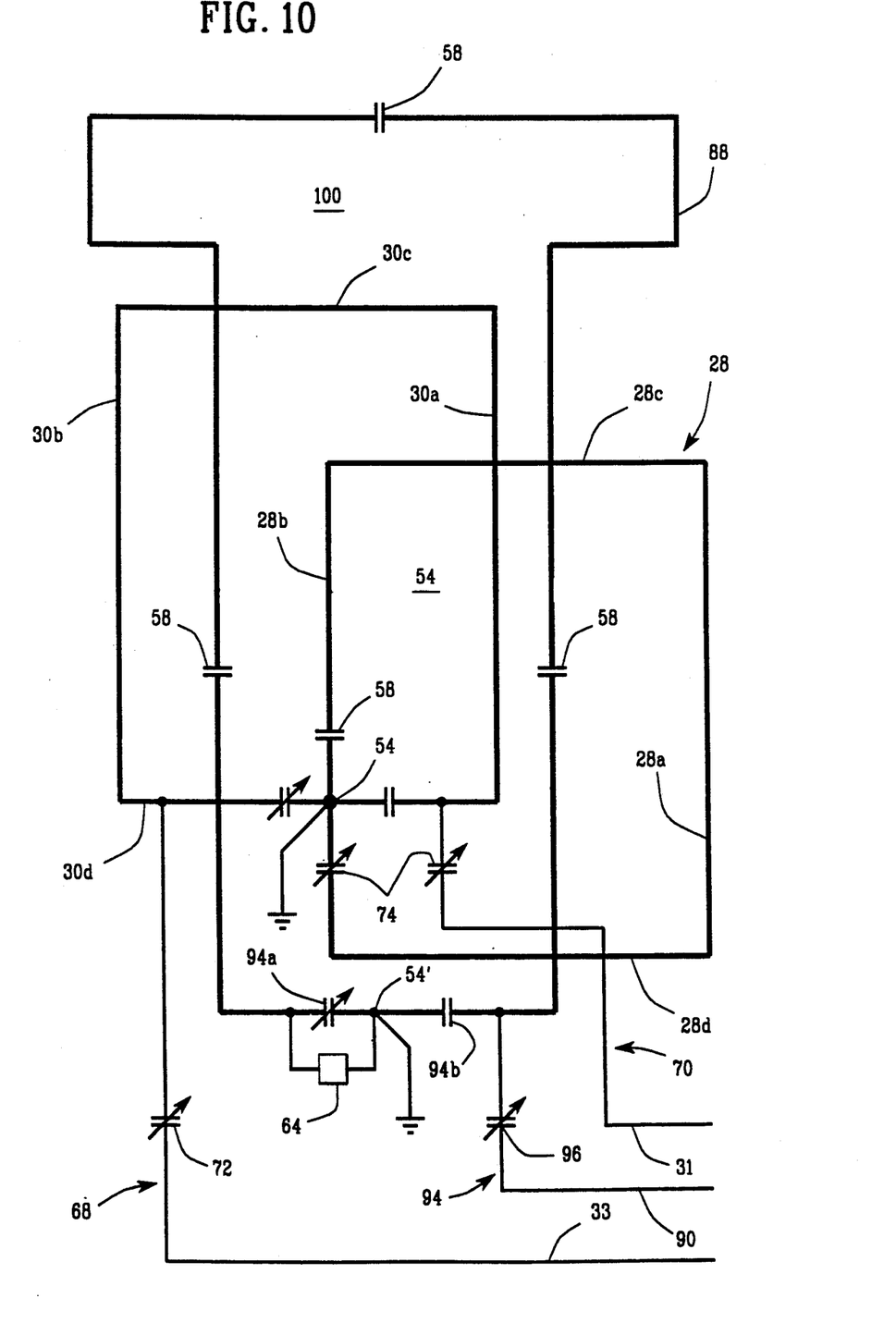
FIG. 10 is a schematic representation of the electrical characteristics of the three loops of the coil of FIG. 8 showing their interconnection at a virtual ground point.

Referring to FIG. 10, the conductor of loop 88 passes downward from the top of the "T" 100 and crosses conductors 28c and 28d and then returns over conductors 30d and 30c to the top of the "T" 100 so as to remain on the outside of the overlap region 54 as it passes over loops 28 and 30.

As shown in FIG. 8, the magnetic flux passing in one direction through loop 88, generated, for example, by current flow in loop 30 within the region bounded by 30c, 30a, 30d and one leg of loop 88 intersecting 30c and 30d, is balanced by the flux passing in the opposite direction through the remaining area of loop 88, and principally area 100. Thus, loop 30 is largely isolated from loop 88 on an inductive basis. Similarly, loop 88 is isolated from loop 28. As before, the portions of the conductor of loop 88 passing over loops 30 and 28 are necked down and separated by an insulator to prevent current flow between the loops and to minimize capacitive coupling.

Alternatively, the "T" of loop 88 may be given an "I" form (not shown) so as to be bilaterally symmetric. In this case the top and bottom portions of the "I", together serve the decoupling function of the top portion 100 of the "T".

Referring again to FIG. 10, the top and left and right sides of loop 88 are broken by capacitors 58 in a manner similar to that done with loops 28 and 30, to tune the loop 88 in series resonance to a frequency commensurate with the Larmor frequency of the precessing nuclei. Two substantially equal capacitors, 94a and 94b, are positioned on the lower side of loop 88 about a virtual ground 54', in a manner similar to that described for loops 28 and 30 above, so that virtual ground 54' maintains an essentially constant voltage with respect to the environment. Virtual ground 54' is connected to virtual ground 54 so that all three loops 28, 30 and 88 have the same virtual ground. The connection between virtual ground 54' and 54 is preferably extremely short to minimize any inductive component of that connection and may be reduced practically to zero by superimposing the loops 28, 30 and 88 at points 54 and 54' spaced apart as necessary by an insulator or on opposite sides of a printed circuit board.

Capacitor 94a flanking point 54' on one side is adjustable to insure the condition that 54' is a virtual ground by compensating for the effect of matching capacitor 96, and 94a is shunted by decoupler 64 (described above) to decouple loop 88 from a fluctuating magnetic fields of high amplitude.

A third coaxial cable 94, forming part of multiple signal cable 34, has its center conductor connected to the terminal of capacitor 94b via matching capacitor 96 removed from virtual ground 54' and its shield connected to virtual ground 54' to receive a voltage signal proportional to the detected NMR signal across capacitor 94b.

Adjustable coupling capacitor 96 is placed in series with the center lead of coaxial cable 94 and serves the same function as coupling capacitor 72 and 74 in coaxial cables 68 and 7, respectively.

As described above, the signals 31, 33, and 90 are combined after reconstruction of images by the MRI system (not shown).

Thus, it can be seen that the third loop 88 may be used to augment the two loops 28 and 30 of the first embodiment but unlike prior art three loop devices, three separate signals are obtained that may be combined to produce an improved signal-to-noise ratio over a two signal quadrature coil.

The axis of sensitivity of loop 88 vertically bisects the region of sensitivity 20 and thus loop 88 need not be changed to adjust the height of the region of sensitivity 20 but must be modified only to preserve inductive isolation from loops 28 and 30 with changes in the relative position of loops 28 and 30.

The above description has been that of a preferred embodiment of the present invention. It will occur to those who practice the art that many modifications may be made without departing from the spirit and scope of the invention. For example, the loops need not be rectangular nor restrained to lie perfectly in a plane but may be curved somewhat up around the supine patient. In order to apprise the public of the various embodiments that may fall within the scope of the invention, the following claims are made.

I claim:

1. An NMR probe for obtaining a signal from precessing nuclei within an imaging volume, the probe comprising:
   a first loop responsive to a uniform magnetic field to have a first reception pattern which couples to a magnetic field of a first orientation within the imaging volume to produce a first signal;
   a second loop responsive to the uniform magnetic field, positioned to be isolated from the first loop and having a second reception pattern which couples to a magnetic field of a second orientation within the imaging volume to produce a second signal, the second orientation having an angular separation from the first orientation of $\theta$ measured in the direction of the precession of the nuclei;
   a phase shift network connected to the second loop for shifting the second signal by $\theta$ to produce a shifted second signal
   a combiner receiving and for combining the first signal and the shifted second signal;
   and wherein the first and second loops are joined electrically at a virtual ground point and wherein the first signal is a voltage measured between a point on the first loop and the virtual ground and the second signal is a voltage measured between a point on the second loop and the virtual ground.

2. The NMR probe of claim 1 wherein the first and second loops are broken by two or more capacitors and the virtual ground is positioned between the capacitors to correspond with points of constant voltage with oscillating current flow through the loops.

3. The NMR probe of claim 1 wherein the first and second loops are planar and positioned to be substantially coplanar.

4. The NMR probe of claim 1 wherein $\theta$ is 90 degrees.

5. The NMR probe of claim 1 wherein the first and second loops are single rectangular conducting loops arranged so that each conductor of each loop is perpendicular or parallel to all other conductors and so that the conductors of the first loop cross those of the second loop at only two points so that the area of overlap may be adjusted to change the height of the imaging volume while preserving isolation between the loops.

6. The NMR probe of claim 1 wherein the first and second loops include passive isolation from uniform magnetic fields.

7. An NMR probe for obtaining a composite signal from precessing nuclei within an imaging volume, the probe comprising:
   a first loop responsive to a uniform magnetic field to have a first reception pattern which couples to a magnetic field of a first orientation within the imaging volume to produce a first signal;
   a second loop responsive to the uniform magnetic field, positioned to be isolated from the first loop and having a second reception pattern which couples to a magnetic field of a second orientation within the imaging volume to produce a second signal, the second orientation having an angular separation from the first orientation $\theta_1$ measured in the direction of the precession of the nuclei;

a third loop responsive to a uniform magnetic field, positioned to be isolated from the first and second loops and having a third reception pattern which couples to a magnetic field of a third orientation within the imaging volume to produce a third signal, the third orientation having an angular separation from the first orientation of $\theta_1$ measured in the direction of the precession of the nuclei;

wherein the first, second and third loops are joined electrically at a virtual ground point and wherein the first signal is a voltage measured between a point on the first loop and the virtual ground and the second signal is a voltage measured between a point on the second loop and the virtual ground, and the third signal is a voltage measured between a point on the third loop and the virtual ground.

8. The NMR probe of claim 7 wherein the first, second and third loops are broken by two or more capacitors and the virtual ground is positioned between the capacitors to correspond with points of constant voltage with oscillating current flow through the loops.

9. The NMR probe of claim 7 wherein the first, second, and third loops are planar and positioned to be substantially coplanar.

10. The NMR probe of claim 7 wherein the first and second loops are single rectangular conducting loops arranged so that each conductor of each loop is perpendicular or parallel to all other conductors and so that the conductors of the first loop cross those of the second loop at only two points so that the area of overlap may be adjusted to change the height of the imaging volume while preserving isolation between the loops.

* * * * *